United States Patent [19]

Kahen

[11] Patent Number: 5,007,063
[45] Date of Patent: Apr. 9, 1991

[54] LASER DIODE
[75] Inventor: Keith B. Kahen, Rochester, N.Y.
[73] Assignee: Eastman Kodak Company, Rochester, N.Y.
[21] Appl. No.: 478,856
[22] Filed: Feb. 12, 1990
[51] Int. Cl.[5] .............................. H01S 3/19
[52] U.S. Cl. ...................... 372/45; 372/50; 357/17
[58] Field of Search .............. 372/45, 46, 43, 44, 372/, 50; 357/16, 17

[56] References Cited

U.S. PATENT DOCUMENTS

| Re. 32,893 | 3/1989 | Miller | 250/211 |
|---|---|---|---|
| 4,525,687 | 6/1985 | Chemla et al. | 332/7.51 |
| 4,528,464 | 7/1985 | Chemla et al. | 307/425 |
| 4,700,353 | 10/1987 | Van Gieson et al. | 372/50 |
| 4,706,255 | 11/1987 | Thornton et al. | 372/50 |
| 4,727,556 | 2/1988 | Burnham et al. | 372/50 |
| 4,727,557 | 2/1988 | Burnham et al. | 372/50 |
| 4,731,789 | 3/1988 | Thornton | 372/45 |
| 4,740,978 | 4/1988 | Göbel et al. | 372/50 |
| 4,802,182 | 1/1989 | Thornton et al. | 372/50 |

FOREIGN PATENT DOCUMENTS 0001590 1/1981 Japan ............................ 372/50

OTHER PUBLICATIONS

"Electrooptic Polarization Modulated Injection Laser" by F. K. Reinhart et al., Integrated and Goided-Wave Optics Technical Digest, Jan., 1980, pp. 28-30.
"Electro-Optic Frequency and Polarization-Modulated Injection Laser" by F. K. Reinhart et al, Applied Physics Letters, vol. 36, No. 12, Jun. 15, 1980, pp. 954-957.
"High Speed Optical Modulation with GaAS/GaAlAs Quantum Wells in a P-i-n Diode Structure" by T. H. Wood et al, Applied Physic Letters, vol. 44, No. 1, Jan. 1, 1984, pp. 16-18.
"Waveguide-Type Optical Modulator of GaAs Quantum Well Double Heterostructures Using Electric Field Effect on Exciton Absorption" by S. Tarucha et al, Japanese Journal of Applied Physics, vol. 24, No. 6, Jun. 1985, pp. L442-L444.
"Active Q Switching in a GAs/AlGaAs Multiquanium Well Laser with an Intracavity Monolithic Loss Modulator" by Y. Arakawa et al, Applied Physics Letters, vol. 48, No. 9, Mar. 3, 1986, pp. 561-563.
"High Power (2.1 W) 10-Stripe AlGaAs Laser Arrays with Si Disordered Face Windows" by R. L. Thornton et al, Applied Physics Letters, vol. 49, No. 23, Dec. 8, 1986, pp. 1572-1574.
"Monolithic Waveguide Coupled Cavity Lasers and Modulators Fabricated by Impurity Induced Disordering" by R. L. Thornton et al, Journal of Lightwave Technology, vol. 6, No. 6, Jun. 1988, pp. 786-792.
"Intracavity Loss Modulation of GaInAsP Diode Lasers" by D. Z. Tsang et al, Applied Physics Letters, vol. 38, No. 3, Feb. 1, 1981, pp. 120-122.

Primary Examiner—Georgia Epps
Attorney, Agent, or Firm—Raymond L. Owens

[57] ABSTRACT

The present invention relates to a laser diode which comprises a substantially rectangular body of a semiconductor material on the surface of a semiconductor substrate. The body has a pair of opposed end surfaces and side surfaces extending between the end surfaces. The body comprises a multiple quantum well active layer between cladding layers. An electrically insulating (separation) region extends through one of the cladding layers and through the active region to divide the body into a laser diode in which light is generated in the active layer by the recombination of oppositely charged carriers, and an absorber which can shift the generated light between the TE and TM modes when a small voltage is applied thereacross. A capping layer of an insulating semiconductor material is over the outermost cladding layer and conductive regions extend through the capping layer to the cladding layer in each of the laser diode and the absorber.

24 Claims, 1 Drawing Sheet

LASER DIODE

FIELD OF THE INVENTION

The present invention relates to the construction of a laser diode, and more particularly to a laser diode which can be quickly and easily switched between two different polarization states.

BACKGROUND OF THE INVENTION

Laser diodes in general comprise a body of a semiconductor material having an active region and regions of opposite conductivity type on opposite sides of the action region. When a voltage of sufficient magnitude is placed across the active region, carriers of opposite conductivity type move into the active region where they recombine to generate light. By forming the regions on each side of the active region of an appropriate material and by providing mirrors at the ends of the active region, the light is confined to the active region where it flows back and forth between the mirrors to form laser light. At least one of the mirrors is made partially transparent so that some of the light will be emitted as a substantially coherent beam of light. Because of its small size and relatively low operating power as compared to other types of lasers, laser diodes are being more generally used in various electro-optical systems, such as optical communication systems. However, one problem with regard to the use of a laser diode in an optical circuit is that laser diodes inherently operate in the transverse electric (TE) mode, and many devices used in optical circuits operate in the transverse magnetic (TM) mode. Presently such circuits are provided with devices which will convert the TE mode beam from a laser diode to the TM mode where necessary. However, this makes the circuit more complicated and more expensive. Therefore, it would be desirable to have a laser diode which can be easily and quickly switched between the TE mode and the TM mode.

SUMMARY OF THE INVENTION

The present invention is directed to a laser diode which includes an absorber region for switching the laser between the TE mode and the TM mode. More particularly, the present invention relates to a laser diode comprising a body of a semiconductor material having a pair of spaced end surfaces, and an active region therein extending between the end surfaces. The body includes means dielectrically separating the laser diode into two sections. One of the sections is provided with means for generating laser light in the active region of the one section. The other section is provided with means for shifting the exciton absorption spectrum so as to absorb predominantly either the TE mode or the TM mode of the laser light.

The invention will be better understood from the following more detailed description taken with the accompanying drawings and claims.

Figure 1:
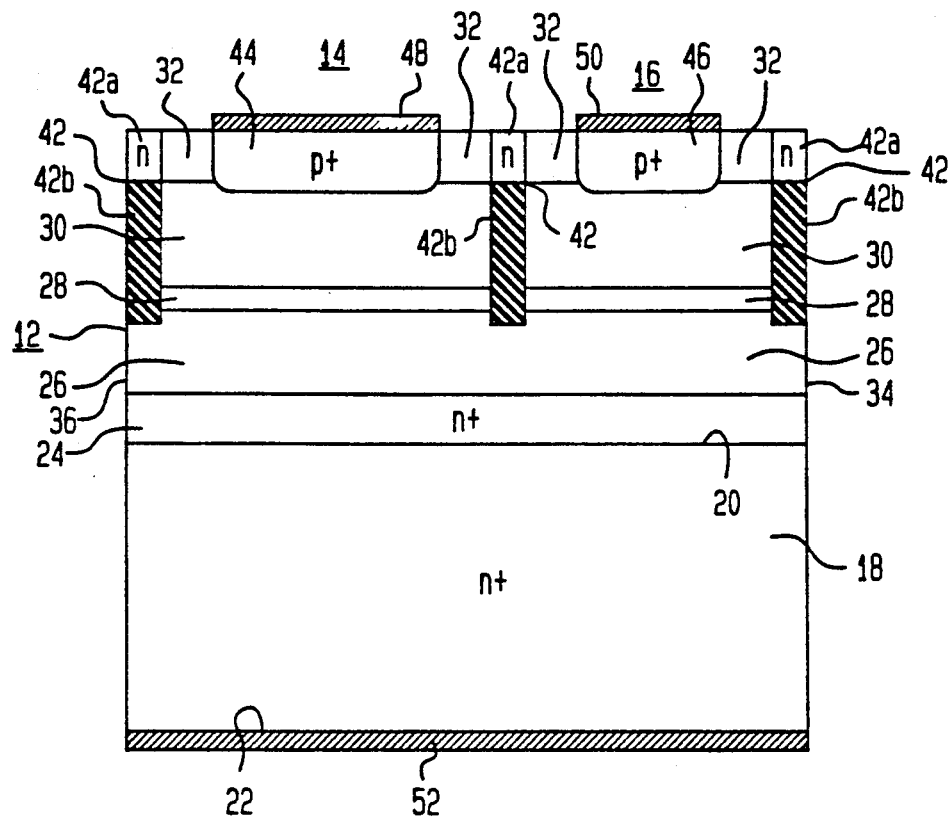
FIG. 1 is a sectional view of a form of the laser diode of the present invention.

It should be understood that the FIGS. of the drawing are not necessarily drawn to scale.

DETAILED DESCRIPTION

Figure 2:
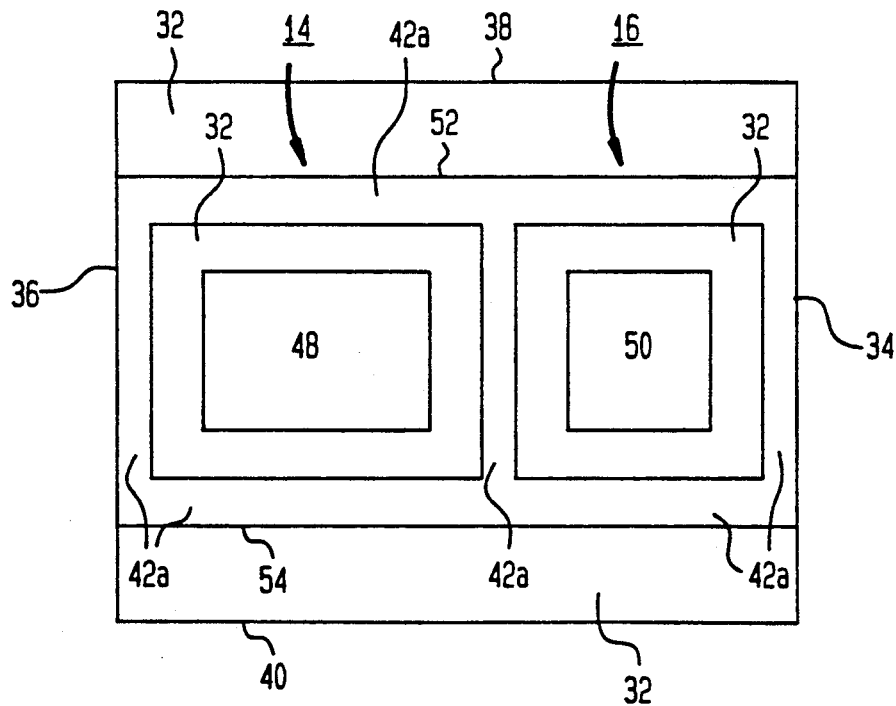
FIG. 2 is a top elevational view of the laser diode of FIG. 1.

Referring to FIGS. 1 and 2, there is shown a laser diode 10 comprising a body 12 having stacked layers of semiconductor material, preferably a group III-V semiconductor material. Body 12 comprises a separation region 42 which comprises an isolation region 42a (shown as having n-type conductivity) and a disordered region 42b. Separation region 42 divides body 12 into a laser diode section 14 and an absorber section 16. The body 12 is on a substrate 18, preferably of high conductivity gallium arsenide of one conductivity type, shown as n+-type, having a pair of opposed surfaces 20 and 22. The body 12 comprises a buffer layer 24, preferably of high conductivity gallium arsenide of the same conductivity type as the substrate 18, shown as n+ type, on the substrate surface 20. On the buffer layer 24 in succession are a first cladding layer 26, a thin active layer 28, a second cladding layer 30 and finally a capping layer 32.

The first and second cladding layers 26 and 30 are preferably superlattice layers formed of alternating layers of 30 Angstroms of gallium arsenide (GaAs) and 10 Angstroms of either aluminum arsenide (AlAs) or aluminum gallium arsenide having a high content of aluminum ($Al_{0.9}Ga_{0.1}As$). The cladding layers are of a thickness of between 0.5 and 1 micrometer and are of opposite conductivity types, such as n-type for the first cladding layer 26 and p-type for the second cladding layer 30. Alternatively, the cladding layers 26 and 30 could be of aluminum gallium arsenide of opposite conductivity types, such as n-type for the first cladding layer 26 and p-type for the second cladding layer 30. The aluminum gallium arsenide can be doped with an appropriate acceptor such as carbon to make it p-type and silicon to make it n-type.

The active layer 28 is a multiple quantum well layer comprising six periods of 100 Angstroms of gallium arsenide (GaAs) alternating with five periods of 100 Angstroms of aluminum gallium arsenide ($Al_{0.33}Ga_{0.67}As$). The portion of the active layer 28 in the absorber section 16 is disordered to shift it to a slightly higher energy. For example, this can be achieved by heating at approximately 950° C. for about 3 minutes, provided there is a layer of silicon dioxide solely on this region. The silicon dioxide layer is removed later. The capping layer 32 is of undoped gallium arsenide (GaAs) which is substantially insulating.

As shown in FIG. 2, the body 12 is in the form of a rectangle having substantially parallel end surfaces 34 and 36, and side walls 38 and 40. The absorber section 16 is electrically isolated from the laser diode section 14 by a portion of the separation region 42. The separation region 42 also extends along the end surfaces 34 and 36 and along interface surfaces 52 and 54. The disordered region 42b is formed by using donor impurity disordering to convert a vertical section through the superlattice structures of layers 28 and 30 and a portion of the superlattice structure of layer 26 into n-type conductivity aluminum gallium arsenide (AlGaAs) layers. A portion of layer 26 is disordered in order to insure that a vertical section completely through layer 28 is disordered. Layer 26 need not be disordered at all or, as is shown, a partial vertical portion thereof can be disordered. The disordering is produced by either ion implantation of an n-type conductivity impurity followed by thermal annealing, or by diffusion of an n-type conductivity impurity, such as silicon. The portions of the insulating capping layer 32 which are exposed to the n-type impurities become separation regions 42a which are of n-type conductivity. The two sections 14 and 16 become isolated because the disordered n-type AlGaAs layers have a different polarity and have a larger energy gap than the p-type superlattice layers 28 and 30, which in turn forms a potential barrier to the flow of holes across the disordered section. The portions of the separation region 42 along the interfaces 52 and 54 serve to confine laterally the laser light and the carriers, and the portion of the separation region 42 along the end surfaces 34 and 36 serves to prevent catastrophic facet damage as a result of laser induced facet heating.

A highly conductive contact region 44 of p-type conductivity extends through the capping layer 32 in the laser section 14 to make electrical contact to the second cladding layer 30. A highly conductive contact region 46 of p-type conductivity extends through the capping layer 32 in the absorber section 16 to make contact to the second cladding layer 30. Separate metal contacts 48 and 50 are on the capping layer 32 over and in ohmic contact with each of the contact regions 44 and 46, respectively. An ohmic metal contact 52 is on the surface 22 of the substrate 18.

The laser diode 10 can be made by epitaxially depositing the buffer layer 24, cladding layer 26, active layer 28, cladding layer 30 and capping layer 32 on the substrate 18 in succession. These layers may be deposited by any well known technique for depositing the particular materials of the layers on the substrate, such as by organo-metallic chemical vapor deposition, or molecular beam epitaxy. The disordered region 42b may be formed by ion implantation of an n-type conductivity impurity, followed by thermal annealing or by diffusion of an n type conductivity impurity, such as silicon, into the body 12. If the cladding layers 26 and 30 are formed solely of aluminum gallium arsenide, the disordered region 42b may be formed by disordering the active layer 28 by implanting an n-type conductivity impurity, followed by thermal annealing or by diffusing an n-type conductivity impurity therein, and the cladding layer 30 made electrically insulating by proton bombardment. The conductive regions 44 and 46 may be formed by diffusing a p-type conductivity impurity of high solubility, such as zinc, into and through the capping layer 32. The contacts 48, 50 and 52 may be applied by any well known technique for depositing a metal on the materials of the body 12, such as by evaporation in a vacuum or sputtering.

The laser diode 12 is turned on by applying a forward bias voltage of about 1.6 volts across the diode section 14 between the contacts 48 and 52 to cause light to be generated in the active layer 28 by the recombination of oppositely charged carriers. The edges 34 and 36 define a cavity within which the light is reflected between the two edges to form a substantially coherent beam of light, some of which is emitted through both of the edges which are effectively partially transparent. The light passes through the absorber section 16, which is unpumped since it is not injected with electrons and holes. Therefore, the absorber section 16 is lossy. The light generated in the laser diode section 14 is normally in the TE mode because this mode has smaller losses and somewhat higher gain compared to the TM mode. However, by applying a small voltage, such as +0.5 volts, across the absorber 16 between the contacts 50 and 52, the exciton absorption spectrum of the active layer 28 in the absorber section 16 can be shifted so that the absorbing section 16 predominantly attenuates the TE mode over the TM mode. The total gain then becomes greater for the TM modes causing the laser to operate in the TM mode. By removing the positive bias voltage applied across the absorber section 16, the exciton absorption spectrum in the active layer 28 is shifted back so that the laser again operates in the TE mode. Thus, the output of the laser diode 10 can be easily and quickly shifted between the TE mode and TM mode by merely applying and removing a small positive bias voltage across the absorber section 16.

It is to be understood that the embodiments of the invention which have been described are illustrative of the invention. Modifications may readily be devised by those skilled in the art without departing from the spirit and scope of the invention. For example, in some applications buffer layer 24 can be eliminated. Still further, materials and compositions different than those described for the cladding layers, active layer and capping layer may be used. Still further, lateral confinement can be obtained by means other than through disordering, such as, a ridge waveguide structure. Furthermore, it is not necessary to have separation regions 42 at both ends to prevent catastrophic damage. Still further, the reflectivity of edges 34 and 36 can be modified by adding layers attached thereto.

I claim:

1. In a laser diode comprising:
   a body of a semiconductor material having a pair of spaced end surfaces;
   an active layer in said body extending between said end surfaces;
   means for dielectrically dividing the active layer into two sections;
   means at one of said sections for generating light in the active layer of said one section; and
   means at the other section for selectively shifting the exciton absorption spectrum of the active layer between predominantly absorbing either the TE or TM modes.

2. The laser diode of claim 1 in which the active layer is a multiple quantum well region.

3. The laser diode of claim 2 in which the quantum well region comprises alternating layers of gallium arsenide and aluminum gallium arsenide.

4. The laser diode of claim 3 in which the quantum well region comprises six layers of 100 Angstroms of gallium arsenide alternating with five layers of 100 Angstroms of aluminum gallium arsenide.

5. The laser diode of claim 2 including a cladding layer on each side of the active layer.

6. The laser diode of claim 5 in which each of the cladding layers is a superlattice layer.

7. The laser diode of claim 6 in which each of the cladding layers comprises alternating layers of gallium arsenide and either aluminum arsenide or aluminum gallium arsenide with the layers being of opposite conductivity types.

8. The laser diode of claim 7 in which each cladding layer is between 0.5 and 1 micrometer in thickness and each gallium arsenide layer is 30 Angstroms in thickness and each layer of aluminum arsenide or aluminum gallium arsenide is 10 Angstroms in thickness.

9. The laser diode of claim 7 in which the means for dielectrically dividing the active layer into two sections comprises a disordered region extending through one of the cladding layers and the active layer.

10. The laser diode of claim 9 in which the disordered region also extends across end surfaces of the body.

11. The laser diode of claim 5 wherein each of the cladding layers comprises a layer of aluminum gallium arsenide with the cladding layers on opposite sides of the active layer being of opposite conductivity types.

12. The laser diode of claim 2 in which the portion of the quantum well region in the other section is partially disordered to shift the exciton absorption spectrum peaks to slightly higher energies.

13. In a laser diode comprising:
a substrate of a conductive semiconductor material;
a substantially rectangular body of a semiconductor material on a surface of said substrate, said body having opposed end surfaces and side surfaces extending between said end surfaces;
a quantum well active layer extending through said body between said end surfaces;
a separate cladding layer extending through said body between said end surfaces on each side of said active layer; and
an electrically insulating region extending through one of said cladding layers and said active layer and dividing the body into a laser diode in which light is generated, and a absorber which can shift the generated light between the TE and TM modes.

14. The laser diode of claim 13 in which the quantum well active layer is a multiple quantum well comprising alternating layers of gallium arsenide and aluminum gallium arsenide.

15. The laser diode of claim 14 in which the quantum well active layer comprises six layers of 100 Angstroms of gallium arsenide alternating with five layers of 100 Angstroms of aluminum gallium arsenide.

16. The laser diode of claim 15 in which each of the cladding layers comprises alternating layers of gallium arsenide and either aluminum arsenide or aluminum gallium arsenide with the layers being of opposite conductivity types.

17. The laser diode of claim 16 in which each of the cladding layers is between 0.5 and 1 micrometer in thickness and each gallium arsenide layer is 30 Angstroms in thickness and each aluminum arsenide or aluminum gallium arsenide layer is 10 Angstroms in thickness.

18. The laser diode of claim 17 in which the electrically insulating region is a disordered region extending through one of the cladding layers and through the active layer.

19. The laser diode of claim 18 in which the electrically insulating region is disordered with an n-type conductivity impurity.

20. The laser diode of claim 18 in which the disordered region also extends along the end surfaces and parallel to the side surfaces of the body.

21. The laser diode of claim 18 in which the active layer in the absorber is selectively and partially disordered.

22. The laser diode of claim 21 further comprising a capping layer of an insulating semiconductor material over the outermost cladding layer and separate conductive regions extending through the capping layer to the cladding layer in each of the laser diode and absorber.

23. The laser diode of claim 22 further comprising a separate conductive contact on the capping layer over each of the conductive regions and a conductive contact on the surface of the substrate opposite the body.

24. The laser diode of claim 15 in which the cladding layers are composed of aluminum gallium arsenide of the opposite conductivity types.

* * * * *